(12) United States Patent
Narayanaswamy

(10) Patent No.: US 11,906,330 B1
(45) Date of Patent: Feb. 20, 2024

(54) EFFICIENT COMPRESSION OF SENSOR DATA

(71) Applicant: Itron, Inc., Liberty Lake, WA (US)

(72) Inventor: Gokulmuthu Narayanaswamy, Bangalore (IN)

(73) Assignee: Itron, Inc., Liberty Lake, WA (US)

( * ) Notice: Subject to any disclaimer, the term of this patent is extended or adjusted under 35 U.S.C. 154(b) by 0 days.

(21) Appl. No.: 17/889,718

(22) Filed: Aug. 17, 2022

(51) Int. Cl.
*G01D 4/00* (2006.01)
*G01R 22/06* (2006.01)
*G01R 29/04* (2006.01)

(52) U.S. Cl.
CPC .......... *G01D 4/004* (2013.01); *G01R 22/063* (2013.01); *G01R 29/04* (2013.01)

(58) Field of Classification Search
None
See application file for complete search history.

(56) References Cited

U.S. PATENT DOCUMENTS

| | | | |
|---|---|---|---|
| 2010/0246649 A1 | 9/2010 | De Ruijter et al. | |
| 2021/0247426 A1* | 8/2021 | Liu | G06Q 30/0645 |

FOREIGN PATENT DOCUMENTS

| | | | | |
|---|---|---|---|---|
| AU | 2011261327 A1 | * | 12/2012 | |
| CN | 108775934 A | | 11/2018 | |
| CN | 110880938 A | * | 3/2020 | |
| CN | 111064705 A | * | 4/2020 | |
| CN | 111796775 A | * | 10/2020 | |
| CN | 112770286 A | * | 5/2021 | |
| KR | 20190069789 A | * | 6/2019 | |

OTHER PUBLICATIONS

Qaisar et al., Event-Driven System for Proficient Load Recognition by Interpreting the Smart Meter Data, 2020 ScienceDirect, Procedia Computer Science, 168 (2020), 210-216 (Year: 2020).*
Wang et al., Residential Smart Meter Data Compression and Pattern Extraction via Non-negative K-SVD, IEEE (Year: 2016).*
Wen et al., Compression of smart meter big data: A survey, 2018, Renewable and Sustainable Energy Reviews 91 (2018), 59-69 (Year: 2018).*
PCT Search Report and Written Opinion dated Sep. 11, 2023 for PCT application No. PCT/US23/24071, 31 pages.

* cited by examiner

*Primary Examiner* — Curtis A Kuntz
*Assistant Examiner* — Jerold B Murphy
(74) *Attorney, Agent, or Firm* — Lee & Hayes, P.C.

(57) ABSTRACT

Techniques for efficient compression of sensor data are described herein. In an example, metrology data is received from a metrology device, the metrology data comprising one or more of: voltage (V) data; current (A) data; resistive power (W) data; and volt-amps reactive power (VAR) data. The metrology data is processed, wherein the processing comprises: performing peak-detection on the metrology data, to create data-signals comprising: a timestamped peak-values data-signal; and a peak-removed data-signal. Median-filtering is performed on the peak-removed data-signal, wherein a median-filtered data-signal is created. Level-shift detection is performed on the median-filtered data-signal, wherein a timestamped level-shift data-signal is created. The data is sent to a server. The data may include the timestamped peak-values data-signal and the timestamped level-shift data-signal.

20 Claims, 14 Drawing Sheets

EFFICIENT COMPRESSION OF SENSOR DATA

BACKGROUND

The number of networks and the number of networked devices continues to increase. The operation of such networked devices results in the generation and transmission of large amounts of data. Many devices generate data in the form of a time-series of sensor-data (e.g., timestamped quantity or quality data). Such devices include internet of things (IoT) or "edge devices," such as a utility meter (e.g., an electricity, gas, or water meter). In the case of an electricity meter, the time-series sensor-data provides a wealth of information about a smart electrical grid, but is relentlessly voluminous.

In many cases the data must be sent over a network to a data collector (e.g., a server in a corporate office). This is burdensome on the network, and may require expansion of the network infrastructure. Such an expansion may require considerable investment in time and money.

Accordingly, advancements in the technology of data compression generally, and more particularly compression of sensor data, would be welcomed by the utility industry and industries utilizing IoT devices, edge devices, large amounts of data, and networks with limited capabilities.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components. Moreover, the figures are intended to illustrate general concepts, and not to indicate required and/or necessary elements.

DETAILED DESCRIPTION

Overview

The disclosure describes techniques for providing efficient compression of data, and in an example implementation, the efficient compression of timestamped sensor (e.g., consumption) data from utility meters. In a first example, a processor of an electricity meter may receive timestamped metrology data from a metrology device. The metrology data may include one or more of: voltage (V) data; current (A) data; resistive power (W) data; and/or volt-amps reactive power (VAR) data. The metrology data may be processed before being sent to a server or other data-collector. In an example, a peak-detection filter or algorithm may be used on the metrology data, to create data-signals including a timestamped peak-values data-signal, and a peak-removed data-signal. A median-filtering filter or algorithm may be used on the peak-removed data-signal, thereby creating a median-filtered data-signal. A level-shift detection algorithm may be performed on the median-filtered data-signal, thereby creating a timestamped level-shift data-signal. Data may be sent to a server or other data-collector. The data sent may include: the timestamped peak-values data-signal; and the timestamped level-shift data-signal.

In a second example, a network device may include a processor, a metrology device configured to measure utility consumption and to thereby produce metrology data, and one or more memory devices in communication with the processor. The network device may include applications defined in the one or more memory devices and executed by the processor. In an example, applications may include one or more filters, transforms, executable algorithms, etc. A peak detector application may be configured to receive the metrology data from the metrology device as input, and configured to create data including a timestamped peak-values data-signal and a peak-removed data-signal. A median filter application may be configured to receive the peak-removed data-signal, and configured to create a median-filtered data-signal. A level-shift detector application may be configured to receive the median-filtered data-signal, and configured to create a timestamped level-shift data-signal. A connection to a network may be used by the processor to cause transmission of the timestamped peak-values data-signal and the timestamped level-shift data-signal over the connection to the network to a server.

Example System and Techniques

Figure 1:
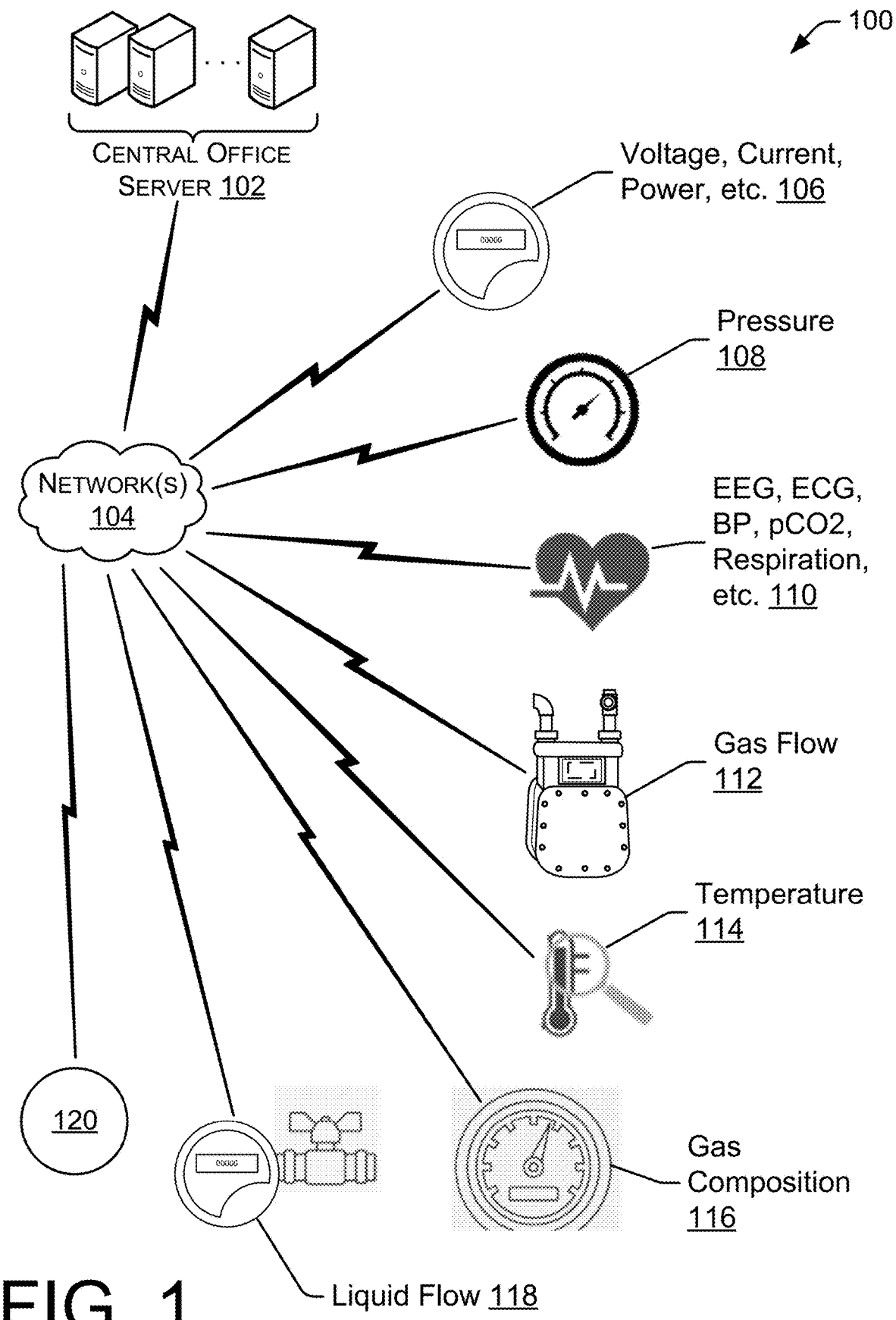
FIG. 1 is a block diagram showing an example network and example edge devices, each of which may generate large amounts of data.

FIG. 1 shows a first example network 100 and example edge devices 106-120, each of which may generate large amounts of data. In the example shown, a central office server 102 is connected to a network. The central office server 102 is representative of at least one, and potentially many, such servers, data-collectors, and/or computing devices attached to the network. Each such server may manage one or more networked nodes (e.g., potentially thousands of such nodes). Each node may be part of the internet of things, and accordingly may be an item for sale in a store, a vehicle on the road, a utility meter at a customer site, or any of millions of networked devices. Such networked devices may receive software, software updates, instructions, and information. The networked devices may send data back to the server 102, which may include a location and/or status of the networked device, measurements made by the networked device, sensor data, metering data, photo/audio/video data, etc. The data may be voluminous, based upon the data-acquisition rate of each node, and also based on the number of nodes.

In the example shown, one or more utility meters 106 may send timestamped utility consumption data, including voltage (V) data, current (A) data, resistive power (W) data, and/or volt-amps reactive power (VAR) data, etc., to the server 102. Software, information, commands, and other data may be exchanged between the utility meter 106 and the server 102 over the network 104.

One or more pressure-sensing node(s) 108 may be part of a natural gas delivery system, or may report tire air pressure of vehicles, such as a trucking fleet. One or more medical sensors 110 may send data packets related to oxygen levels, heart rate, etc. One or more gas meters 112 may report data such as flowrate, temperature, pressure, etc. One or more temperature gauges 114 may report the temperature, such as within rooms of a building as part of an HVAC system, or the temperature of engines, weather stations, and other objects. One or more gas composition devices 116 may analyze gas flows (e.g., in a gas-delivery system) to determine characteristics and/or quality. One or more liquid flow devices 118 may determine water consumption or other information. A generic device 120 is representative of the millions of devices that are part of the internet of things that send vast quantities of data to their respective servers and/or data collectors. In a final but not limiting example, generic device 120 may be a "doorbell camera," and may send audio/video data to a data collector (e.g., a corporate server or a customer's cell phone).

Figure 2:
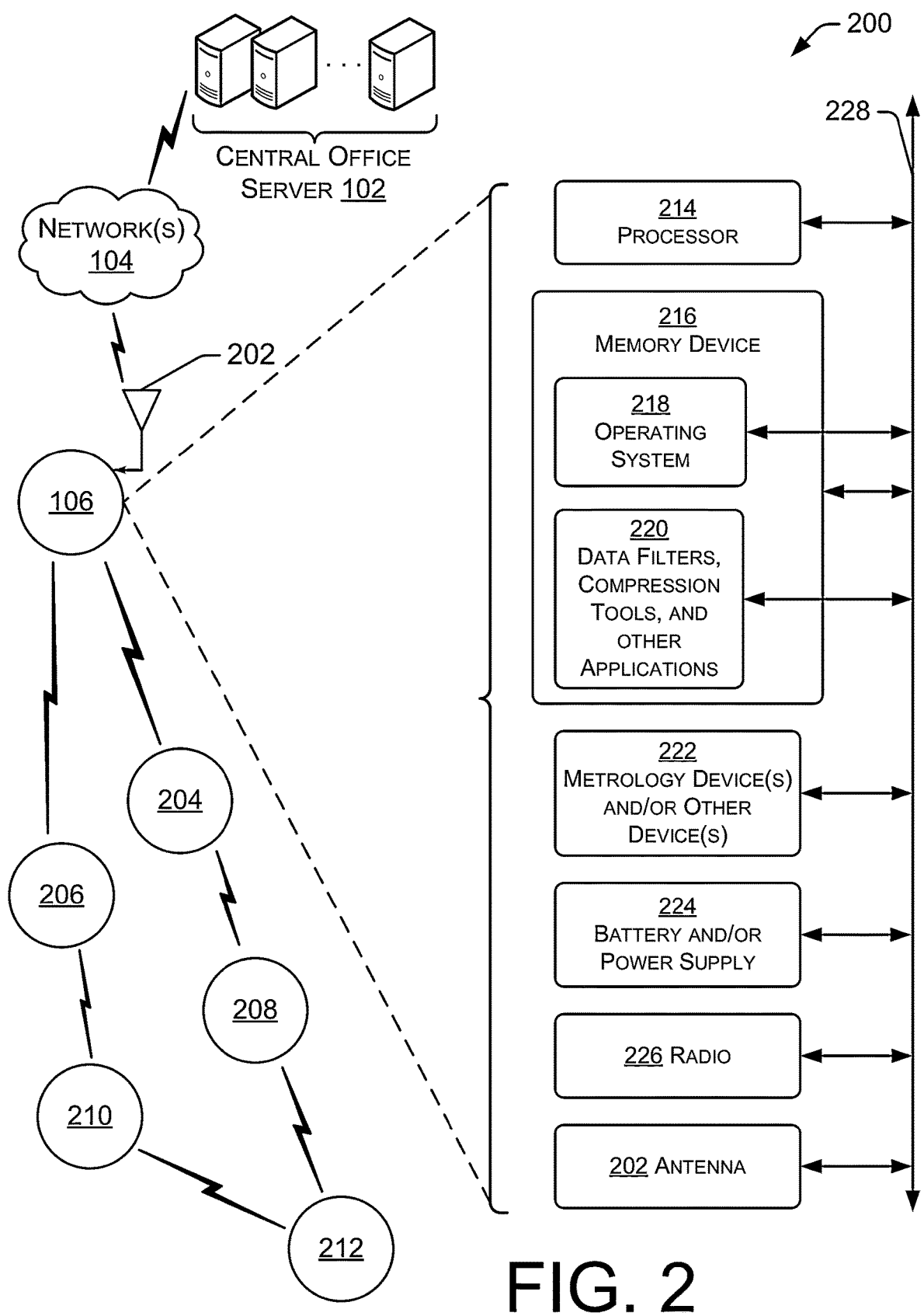
FIG. 2 is a block diagram showing a second example network, wherein the networked devices are utility meters, (e.g., electricity meters) and example detail of a utility meter is shown.

FIG. 2 shows a second example network 200, wherein the networked devices are utility meters, (e.g., electricity meters) and example detail of a utility meter 106 is shown. In the network 200, the central office server 102 is in communication over a network 104 with a plurality of electricity meters 106, 204-212. Example detail of the electricity meter 106 is shown. A processor 214 is in communication with one or more memory devices 216 over a bus 228. An operating system 218 is executable by the processor 214.

One or more data filters, compression tools, transforms, algorithms, techniques, and/or applications 220 may also be located on the memory device(s) 216 and executable by the processor 214. In examples, the applications 220 may be used in a coordinated manner to perform tasks such as sorting data according to priority, compressing the data, and/or applying other techniques to reduce data size and reduce network transmission burden. The coordinated manner of use may include advantageous selection of one or more applications 220 and proper sequencing of the selected application(s) to process the incoming data prior to transmission.

In the example, data may be generated by metrology device(s) 222, which may include related sensors, peripheral devices, and/or associated devices. A battery and/or power supply 224 may be used. In the example of a gas or water utility meter a battery may be used, while any utility meter may benefit from the regulation of voltage and/or current provided by a power supply.

A radio 226 and antenna 202 may be used either in a star or mesh type network. Accordingly, data packets may be relayed through one or more devices from the utility meter 106 to the central office server 102.

Figure 3:
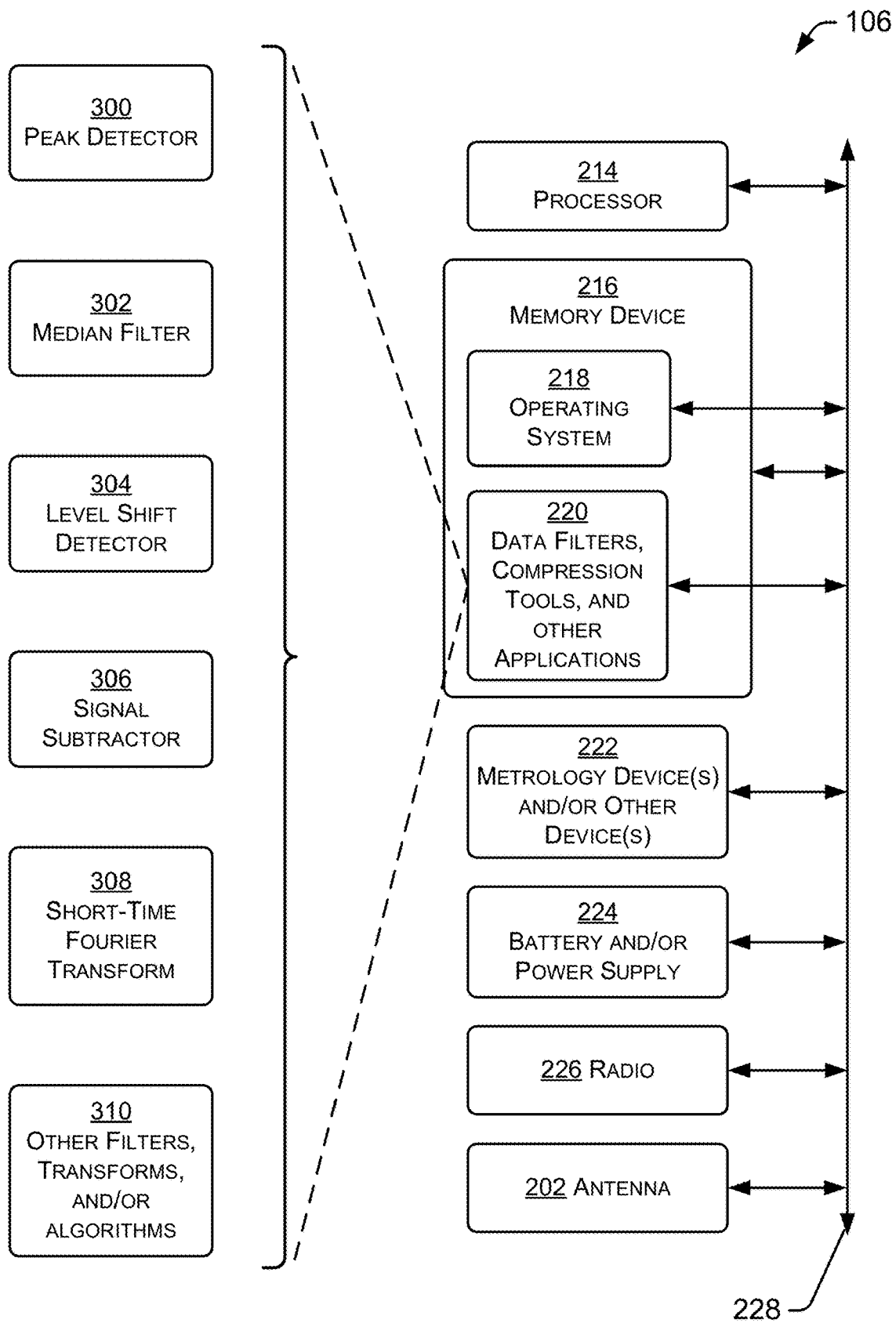
FIG. 3 is a block diagram showing additional detail of the utility meter shown in FIG. 2.

FIG. 3 shows additional detail of the utility meter 106 shown in FIG. 2. In particular, example elements of the data filters, compression tools, and other applications 220 are disclosed. In the example, a peak detector 300 is configured to examine data for peaks (e.g., timestamped data having a value (i.e., the "peak") that is greater than a threshold value). In a first example, once one or more peaks are found and/or identified in an incoming data stream, such peaks can be indicated within an output signal, thereby forming a timestamped peak-values data-signal. In a second example, such peaks can be removed (such as within the output data-signal or a second output data-signal), thereby forming a peak-removed data-signal.

A median filter 302 is configured to remove noise from an incoming signal. In an example, the incoming signal may be the peak-removed data-signal output by the peak detector 300 to thereby create a median-filtered data-signal. In an example, a window of the median filter 302 is adjustable, to thereby adjust the range over which the median value is calculated.

A level-shift detector 304 is configured to detect a shift in the level of input data, e.g., a timestamped input data-stream. In an example, the median-filtered data-signal output by the median filter 302 is examined by the level-shift detector 304. In an example, a level-shift may indicate a change in a consumption value, or a consumption flowrate, of the metrology data measured by the metrology device 222 of the utility meter 106. Responsive to the level change, a timestamped level-shift data-signal may be produced.

A signal subtractor 306 is configured to subtract one or more input data-signals from another input data-signal to thereby create a new data-signal. In an example, a timestamped peak-values data-signal and a timestamped level-shifted data-signal may be subtracted from metrology data. In this example, the output from the signal subtractor would include a less-relevant data-signal, i.e., a data-signal comprising a combination of noise and data that is generally less relevant for most purposes (e.g., less relevant than the timestamped peak-values data-signal and/or the time-stamped level-shifted data-signal).

A short-time Fourier transform 308 is configured based on design requirements of a particular system, and results in appropriate signal processing for that system. In an example, the short-time Fourier transform 308 may compress the less-relevant data-signal received from the signal subtractor to create a lossy compressed data-signal. The lossy compressed data-signal may be transmitted to a data-collector, a remote server, or another computing device.

Depending on system design requirements, other filters, transforms, and/or algorithms 310 may be added to the utility meter 106 or other networked device(s). Accordingly, the filters, transforms and algorithms, etc., that were specifically disclosed are representative of preferred devices, but are not intended to limit the system to only their use.

Figure 4:
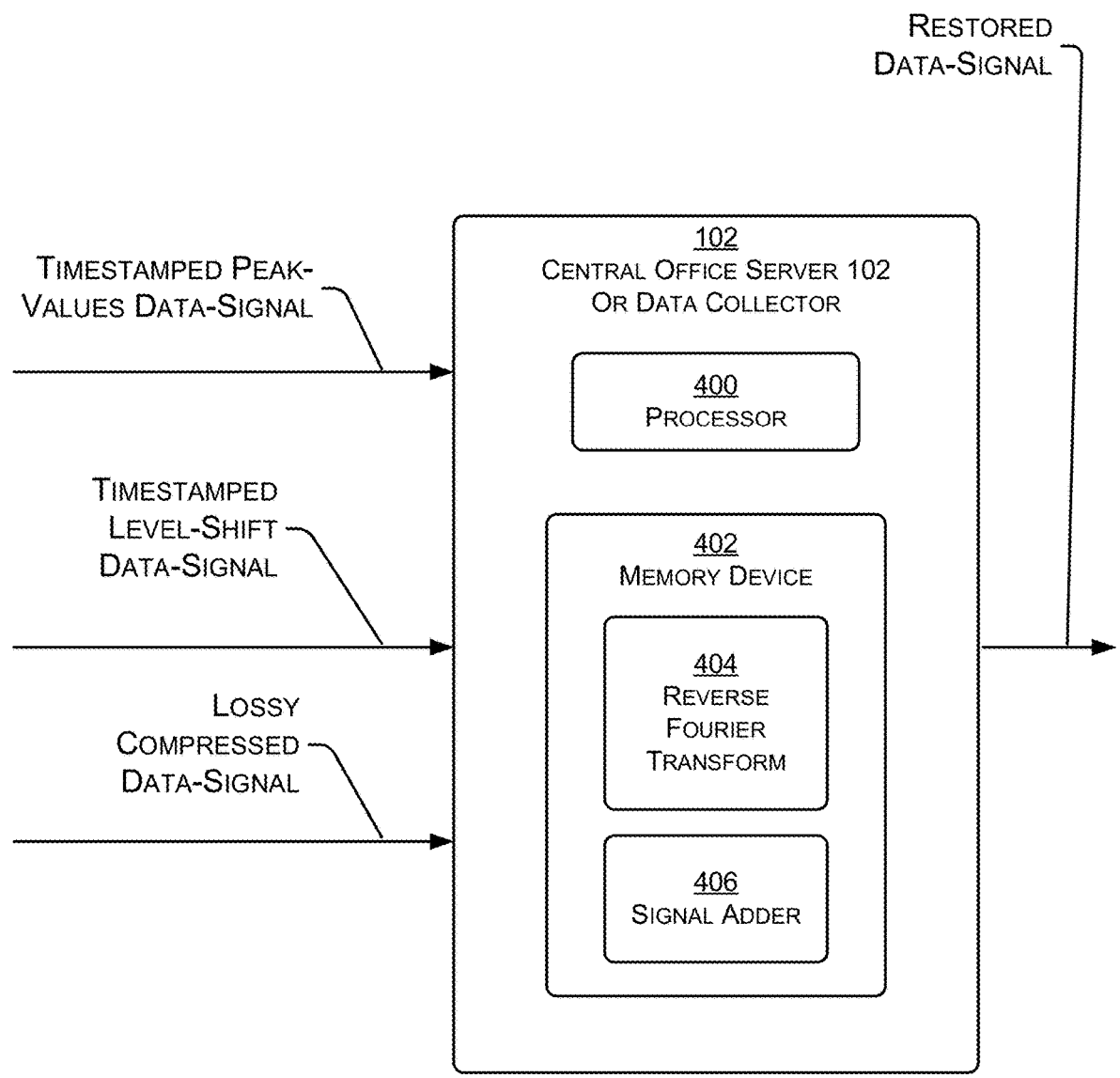
FIG. 4 is a block diagram showing example detail of the central office server, data-collector and/or networked computing device.

FIG. 4 shows example detail of the central office server 102, data-collector, and/or networked computing device. In the example, input signals may include a timestamped peak-values data-signal, a timestamped level-shift data-signal, and optionally, a lossy compressed data-signal. The output may include a restored data signal. If the lossy compressed data-signal was not input, then the restored data signal may have much less data than the original signal (e.g., metrology data) from which the timestamped peak-values data-signal and the timestamped level-shift data-signal were obtained.

A processor 400 is in communication with one or more memory devices 402. In the example shown, a reverse Fourier transform 404 is configured to receive the lossy compressed data-signal from a short-time Fourier transform (e.g., short-time Fourier transform 308 of FIG. 3). The reverse Fourier transform 404 is additionally configured to create a decompressed less-relevant data-signal as output.

A signal adder 406 is configured to add two or more data-signals together, to result in a composite, compound and/or merged output data-signal. In an example, the signal adder 406 may be configured to add signals provided by a utility meter or other networked node to create an output data-signal. In a further example, the signal adder 406 may add data-signals from the utility meter, including: a timestamped peak-values data-signal; a timestamped level-shift data-signal; and a decompressed less-relevant data-signal to create the restored data-signal. The restored data signal may approximate the metrology data originally generated by the utility meter.

Figure 5:
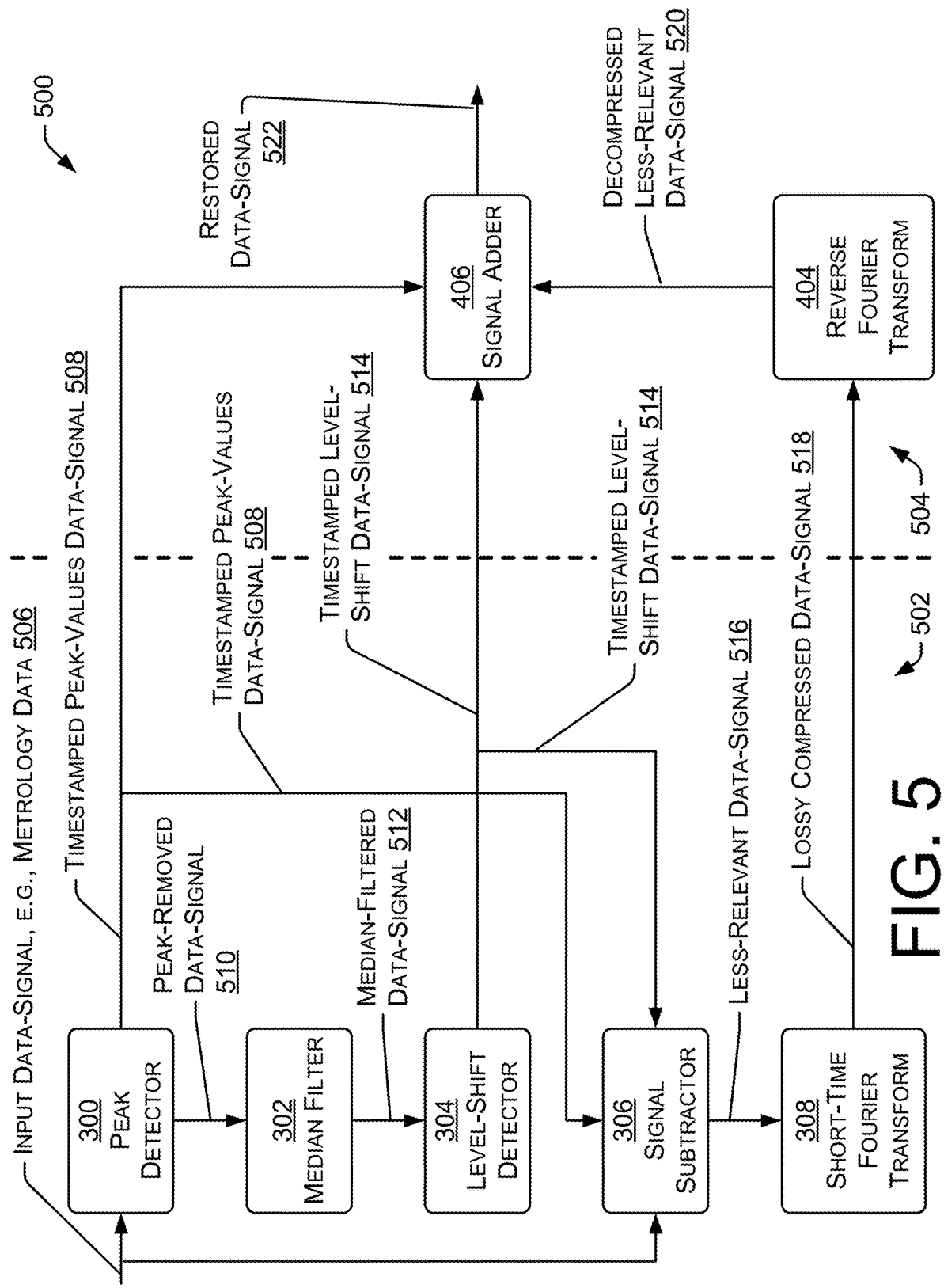
FIG. 5 is a flow diagram showing a first example method to filter and/or compress data, showing example filters, transforms, and/or algorithms, and showing descriptions and flow paths of different data types.

FIG. 5 shows an example system 500 and associated method to process data and/or data-signals. Some of the activities 502 are performed to the left of the dashed line, i.e., in a networked node (e.g., network node 106 of FIGS. 1-3). Other activities 504 are performed to the right of the dashed line, i.e., in a data-collector, server, and/or computing device (e.g., server 102 of FIGS. 1, 2 and 4).

An input data-signal 506 may include metrology data from a utility meter. In the case of an electricity meter, the data-signal 506 may include one or more of: voltage (V); current (A); resistive power (W); and volt-amps reactive power (VAR) data. In the case of a water meter, the data-signal 506 may include flowrate, time, pressure, amount of different contaminant gases like water vapor and hydrogen sulfide, level of contamination, pH value, and/or other data. In the case of a gas meter, the data-signal 506 may include flowrate, temperature, pressure, the amount of different contaminant gases like water vapor and hydrogen sulfide, and/or other information.

A peak-detector 300 evaluates the incoming data-signal 506 (e.g., metrology data), and locates (e.g., locates the times of) peak data values. A threshold is adjustable, to determine an amplitude required for data to be considered, and/or qualify as, "a peak." In the example, two signals are created as output. A timestamped peak-values data-signal 508 is sent to the server to be processed by the signal adder 406, and is also sent to the signal subtractor 306 of the metrology device. A peak-removed data-signal 508 is sent to the median filter 302.

At the median filter 302, signal noise is filtered from the peak-removed data-signal 510. A window is adjustable, to determine a range over which an averaging function is operated. The output is a median-filtered data-signal 512, which may be sent to the level-shift detector 304.

At the level-shift detector 304, the median-filtered data-signal 512 is examined for shifts in the level (e.g., shifts in data values over a first threshold value, at times less than a second threshold value apart). A threshold is adjustable, to determine an amplitude required for data to be considered, and/or qualify as, "a level-shift.". The result is a timestamped level-shift data-signal 514, which is sent to the server to be processed in the signal adder 406.

In an optional embodiment, the input data-signal 506 is sent to the signal subtractor 306 as an input signal. The timestamped peak-values data-signal 508 and the timestamped level-shift data-signal 514 are subtracted from the input data-signal 506, to thereby result in the less-relevant data-signal 516, which is sent to the short-time Fourier transform 308.

At the short-time Fourier transform 308, the less-relevant data-signal 516 is compressed to form the lossy compressed data-signal 518. In the example, the lossy compressed data-signal 518 is sent to the server to be processed by the reverse Fourier transform 404.

At the reverse Fourier transform 404 the lossy compressed data-signal 518 is decompressed to form a decompressed less-relevant data-signal 520. The decompressed less-relevant data-signal 520 may be sent to the signal adder 406.

At the signal adder 406, the timestamped peak-values data-signal 508 and the timestamped level-shift data-signal 514 are added together. Optionally, the decompressed less-relevant data-signal 520 is also added. The resulting output is the restored data-signal 522, which is approximately the same as the input data signal 506.

The use of the signal subtractor 306, the short-time Fourier transform 308 and the reverse Fourier transform 404 are optional. The benefit of using these procedures (i.e., subroutines, applications, etc.) is that information from the less-relevant data-signal 516 is substantially transferred to the restored data-signal 522. However, the less-relevant data-signal 516 may not be needed by the server, and may not be helpful if included in the restored data-signal 522.

Example Data Resulting from Example Data Processing Algorithms

FIGS. 6 through 10 show aspects of data in relation to the operation of a plurality of filters, transforms, and/or algorithms. In an example, two hours of VAR data (e.g., sent every second) will result in an original value of 7200 data points. However, the 7200 points may be reduced in the following example to 219 data points. In the example, 17 data peaks are present. The levelled median data may include 56 data points. Including timestamps, 146 data values are present. Accordingly, an overhead of almost 7000 data points is removed over the two-hour span. In the example, the number of data points may be adjusted (i.e., "tuned") by adjusting levels of precision, such as the minimal height of peaks, level-changes, etc. The remaining data may be compressed by operation of a Fourier transform of time-segments (i.e., data representing periods of time) of the data. Note when comparing FIGS. 6 through 10, that FIGS. 6 and 9 have a vertical scale of 1000, FIGS. 7 and 8 have a vertical scale of 350, and FIG. 10 has a vertical scale of 80.

Figure 6:
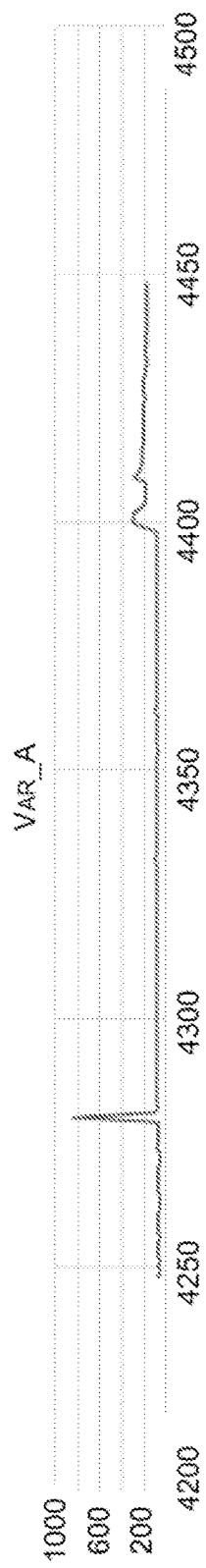
FIGS. 6 through 10 are graphs showing aspects of data in relation to the operation of a plurality of filters, transforms, and/or algorithms.
Figure 7:
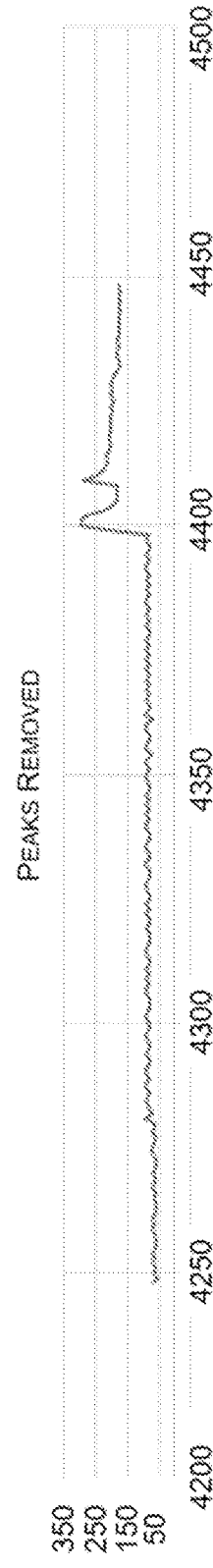

FIGS. 6 and 7 show aspects of peak detection and removal. In an example, these actions could be performed by the peak detector 300 seen in FIGS. 3 and 5.

FIG. 6 shows the identification of peak(s) within a time window of data. A peak is a location that temporarily has higher data values than other locations associated with a short time interval. In the example of FIG. 5, the peak detector 300 is configured to identify such peaks in a data-stream or data-signal.

FIG. 7 shows example peak removal, wherein the peak shown in FIG. 6 has been removed from the data-signal of FIG. 7.

Figure 8:
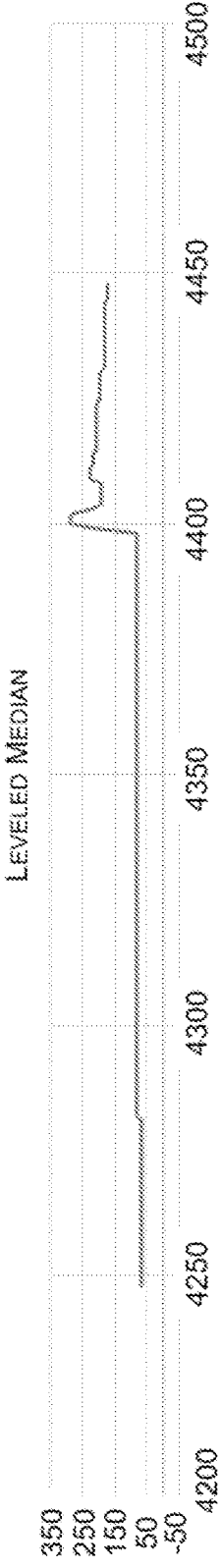

FIG. 8 shows the result of a median filter, which has removed noise (e.g., the noise seen in FIG. 7).

Figure 9:
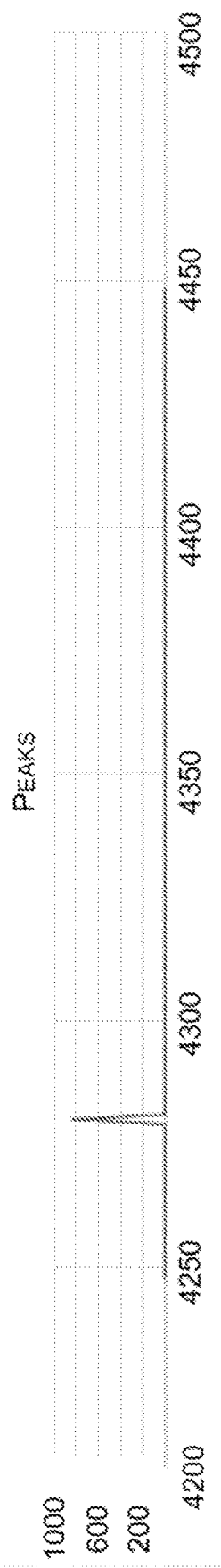

FIG. 9 shows an example of a data-signal having a peak within the time-range shown. Accordingly, the data-signal of FIG. 9 is analogous to the timestamped peak-values data-signal 508 seen in FIG. 5.

Figure 10:

FIG. 10 shows a "remaining signal," and is analogous to the less-relevant data-signal 516 of FIG. 5. In an example, such a signal results from the removal of data peaks, median filtering, and level-shift detection.

Example Methods

In some examples of the techniques discussed herein, the methods of operation may be performed by one or more application specific integrated circuits (ASIC) or may be performed by a general-purpose processor utilizing software defined in computer readable media. In the examples and techniques discussed herein, the memory 216, 402 may comprise computer-readable media and may take the form of volatile memory, such as random-access memory (RAM) and/or non-volatile memory, such as read only memory (ROM) or flash RAM. Computer-readable media devices include volatile and non-volatile, removable, and non-removable media implemented in any method or technology for storage of information such as computer-readable instructions, data structures, program modules, or other data for execution by one or more processors of a computing device. Examples of computer-readable media include, but are not limited to, phase change memory (PRAM), static random-access memory (SRAM), dynamic random-access memory (DRAM), other types of random access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transitory medium that can be used to store information for access by a computing device.

As defined herein, computer-readable media includes non-transitory media, and does not include transitory media, such as modulated data signals and carrier waves, and/or other information-containing signals.

Figure 11:
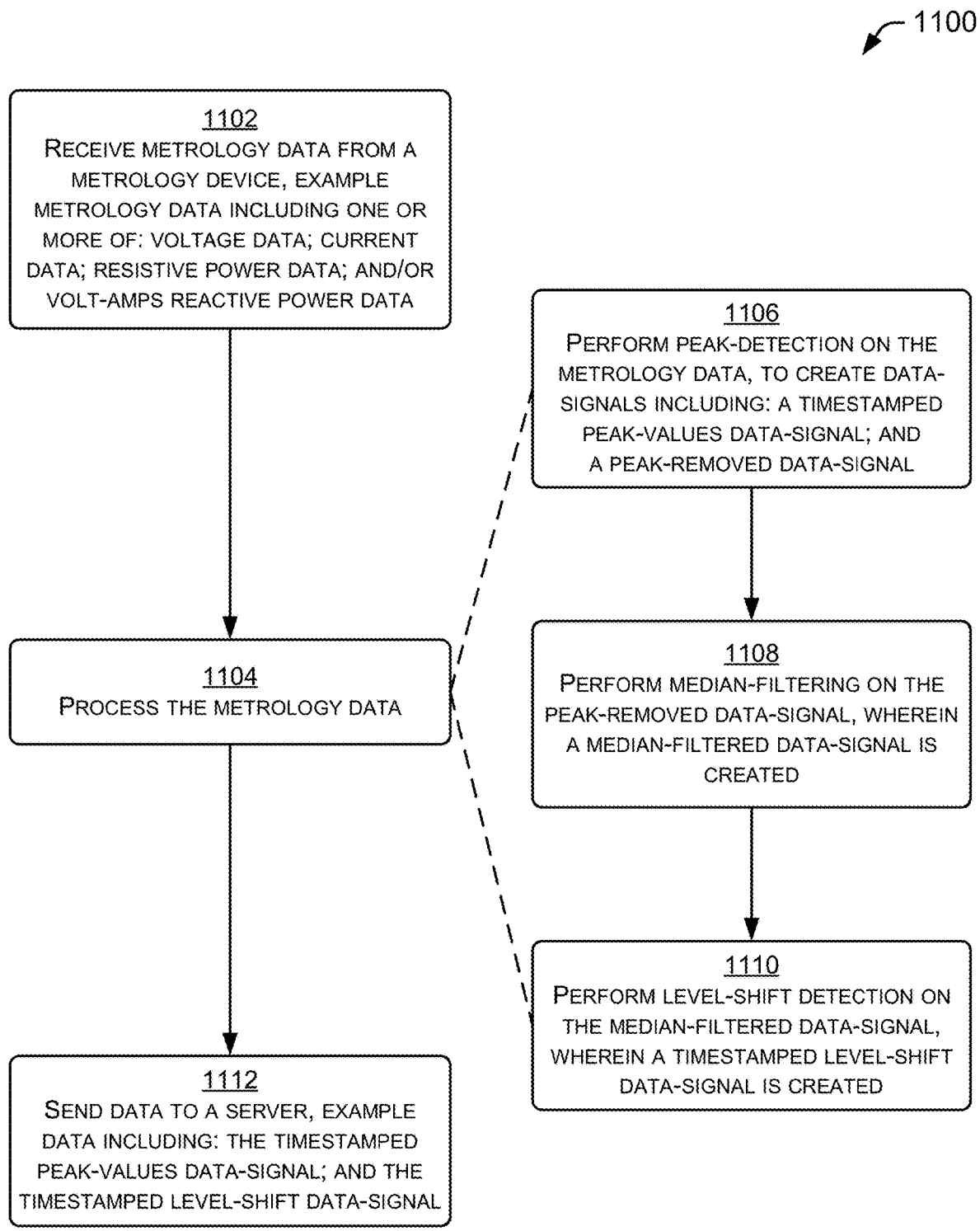
FIG. 11 is a flow diagram showing a second example method to filter and/or compress data.

FIG. 11 shows an example method 1100 to filter and/or compress data. In an example, one or more filters, detectors, transforms, etc. are used to detect and manage data features and to compress data to thereby reduce network traffic while still providing the benefit of the data gathered and/or generated by numerous networked edge devices. In an example, a peak detector, a median filter, and/or a level-shift detector may be used to process the data. In an example network, the networked devices may include utility meters, which generate consumption data as well as other information used for the efficient management of the smart electrical grid.

At block 1102, metrology data from a metrology device is received. In an example, the data may be received by the processor of a metering device, and may have been generated by a metrology unit, one or more sensors, and/or other devices. In the example of data generated by a metrology unit, the metrology data may include one or more types of data including: voltage data; current data; resistive power data; and/or volt-amps reactive power data. In the example of FIG. 2, the metrology device(s) 222 may provide data to the processor 214.

At block 1104, the metrology data is processed. The processing may be based on design requirements of a specific system. Blocks 1106 through 1110 provide three example processing techniques. However, additional and/or different processing algorithms could be used. Accordingly, the techniques (e.g., applications and/or algorithms) used to process the metrology data may be selected and/or configured in an ordered sequence based at least in part on design requirements or a design specification. The design requirements may include the need for certain types of data at the server, the constrains of network throughput, and/or the processing or battery power of the edge device (e.g., utility meter).

At block 1106, peak-detection on the metrology data may be performed to create data-signals including: a time-stamped peak-values data-signal; and a peak-removed data-signal. In the example of FIGS. 3 and 5, the peak detector 300 is shown using a configuration that causes output in the form of a timestamped peak-values data-signal and a peak-removed data-signal. A threshold value may be set to determine a minimum "height" of value to qualify as a peak.

At block 1108, median-filtering may be performed on the peak-removed data-signal, thereby creating a median-filtered data-signal. In the example of FIGS. 3 and 5, the median filter 302 is shown using a configuration that inputs the peak-removed data-signal and outputs a median-filtered data-signal. A window may be set to govern aspects of an averaging process of the median filter.

At block 1110, level-shift detection (or change-detection) may be performed on the median-filtered data-signal, thereby creating a timestamped level-shift data-signal. In the example of FIGS. 3 and 5, the level-shift detector is shown using a configuration that inputs the median-filtered data-signal and outputs a timestamped level-shift data-signal. Configurations (or parameters) may be set to balance a false alarm rate, a misdetection rate, and a detection delay rate.

At block 1112, data may be sent to a server or other data-collecting device. In the example transmission of FIG. 3, the processor 214 causes the radio 226 to send the data over the network (e.g., network 104 of FIG. 2). Example data may include: the timestamped peak-values data-signal; and the timestamped level-shift data-signal.

Figure 12:
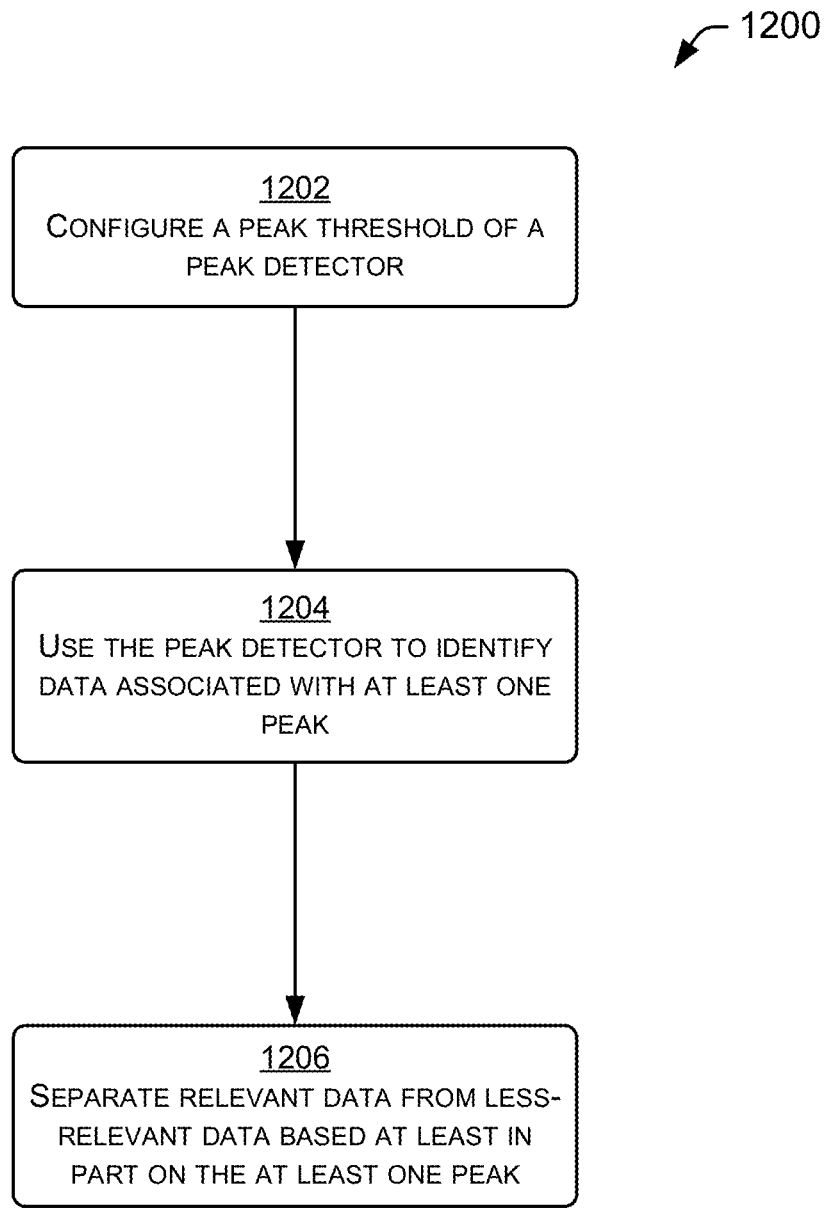
FIGS. 12 through 14 are flow diagrams showing example techniques to configure filters, transforms, and/or algorithms.

FIG. 12 shows example techniques to configure filters, transforms, and/or algorithms. At block 1202, a peak threshold value of a peak detector is configured. The threshold value is used to define data that qualifies as a peak. At block 1204, the peak detector is used to identify data associated with at least one peak, i.e., data that exceeded the threshold value. At block 1206, relevant data is separated from less-relevant data based at least in part on the at least one peak.

Figure 13:
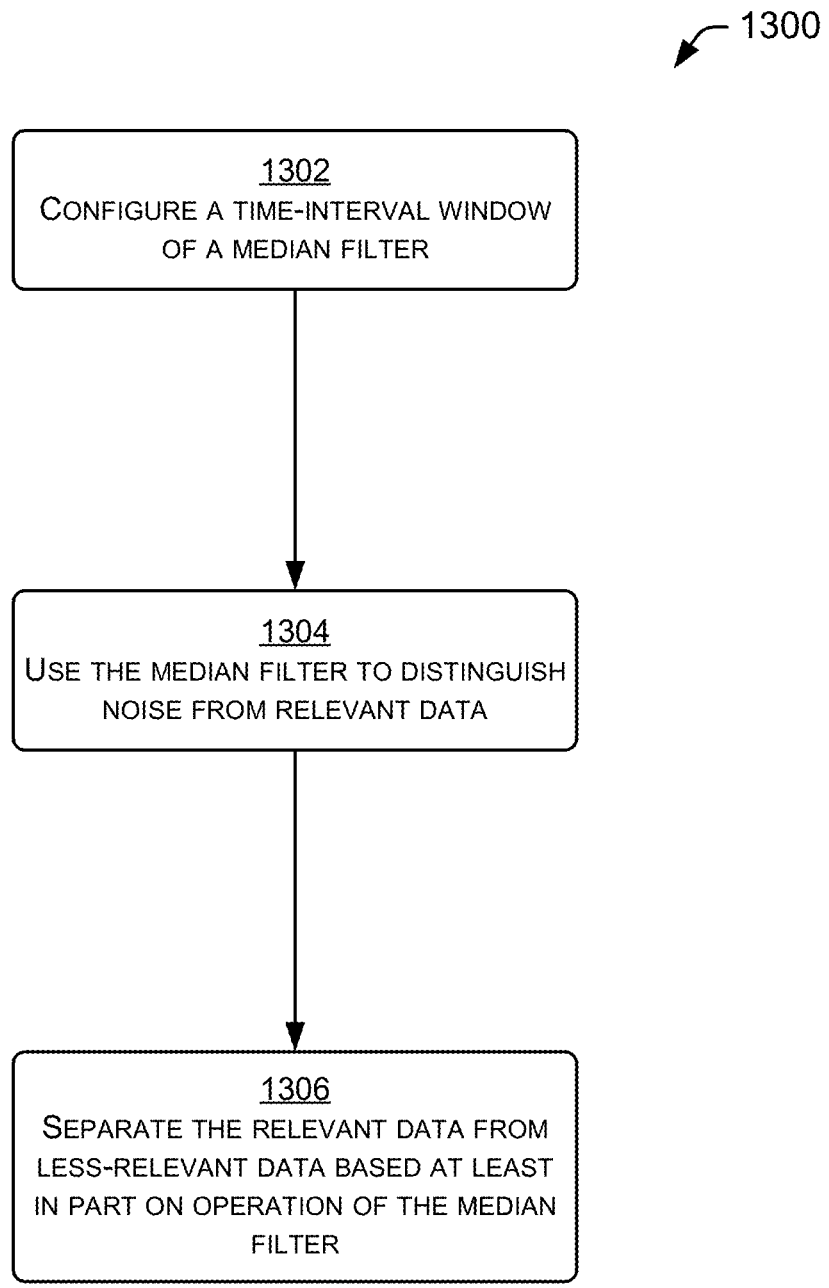

FIG. 13 shows example techniques to configure filters, transforms, and/or algorithms. At block 1302, a time-interval window of a median filter is configured. At block 1304, the median filter is used to distinguish noise from relevant data. At block 1306, the relevant data is separated from less-relevant data based at least in part on operation of the median filter.

Figure 14:
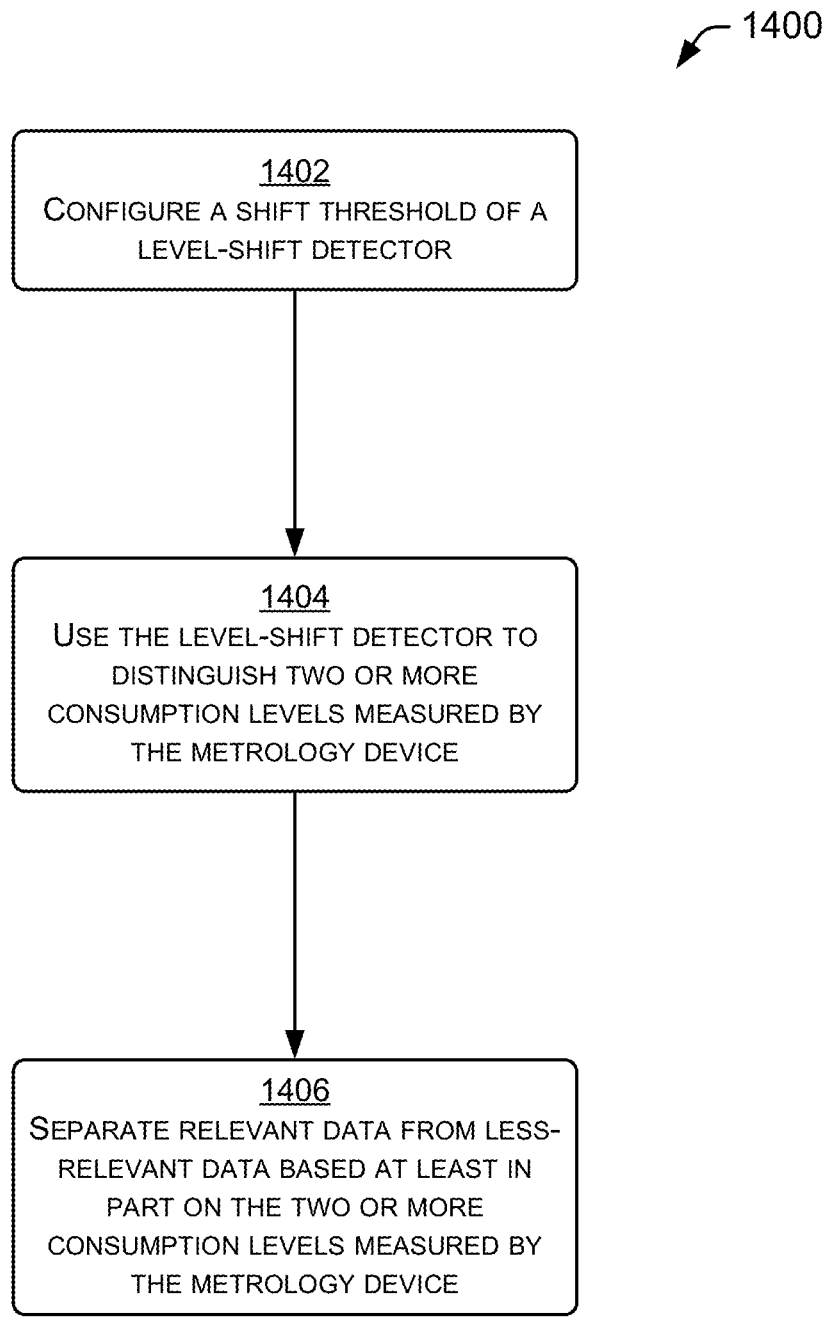

FIG. 14 shows example techniques to configure filters, transforms, and/or algorithms. At block 1402, a shift threshold of a level-shift detector is configured. At block 1404, the level-shift detector is used to distinguish two or more consumption levels measured by the metrology device. At block 1406, relevant data is separated from less-relevant data based at least in part on the two or more consumption levels measured by the metrology device.

Figure 15:
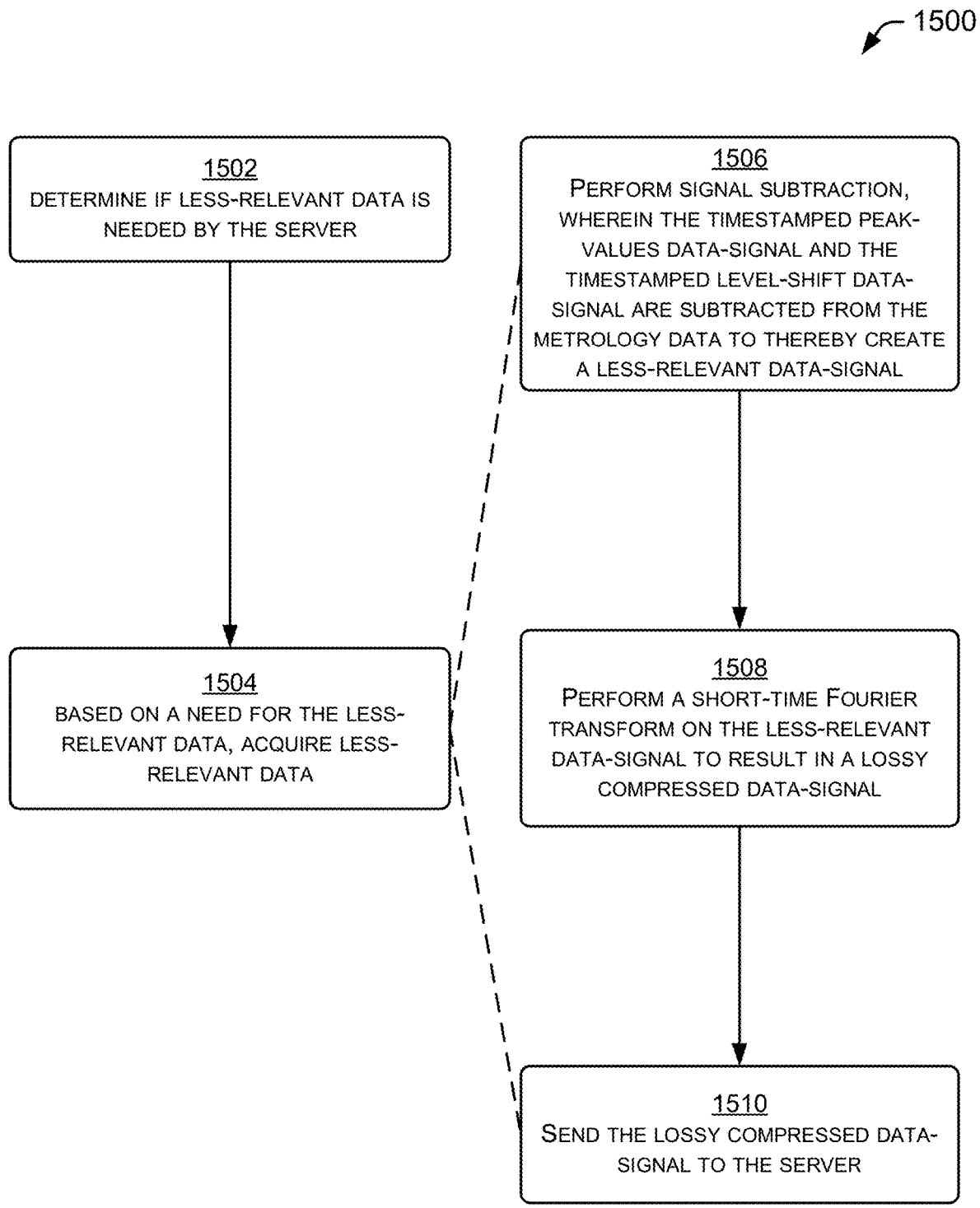
FIG. 15 is a flow diagram showing example techniques to manage less-relevant data.

FIG. 15 is a flow diagram showing example techniques to manage less-relevant data. At block 1502, it is determined if less-relevant data is needed by the server. At block 1504, based on a need for the less-relevant data, less-relevant data is acquired. Blocks 1506 through 1510 describe an example method by which less-relevant data may be obtained. At block 1506, signal subtraction may be performed. In an example, the timestamped peak-values data-signal and the timestamped level-shift data-signal are subtracted from the metrology data to thereby create a less-relevant data-signal. At block 1508, a short-time Fourier transform may be performed on the less-relevant data-signal to result in a lossy compressed data-signal. In an example, the lossy compression level can be adjusted by adjusting the window size. A smaller window will result in less loss but more data. A larger window will result in more loss but less data. At block 1510, the lossy compressed data-signal may be sent to the server.

Figure 16:
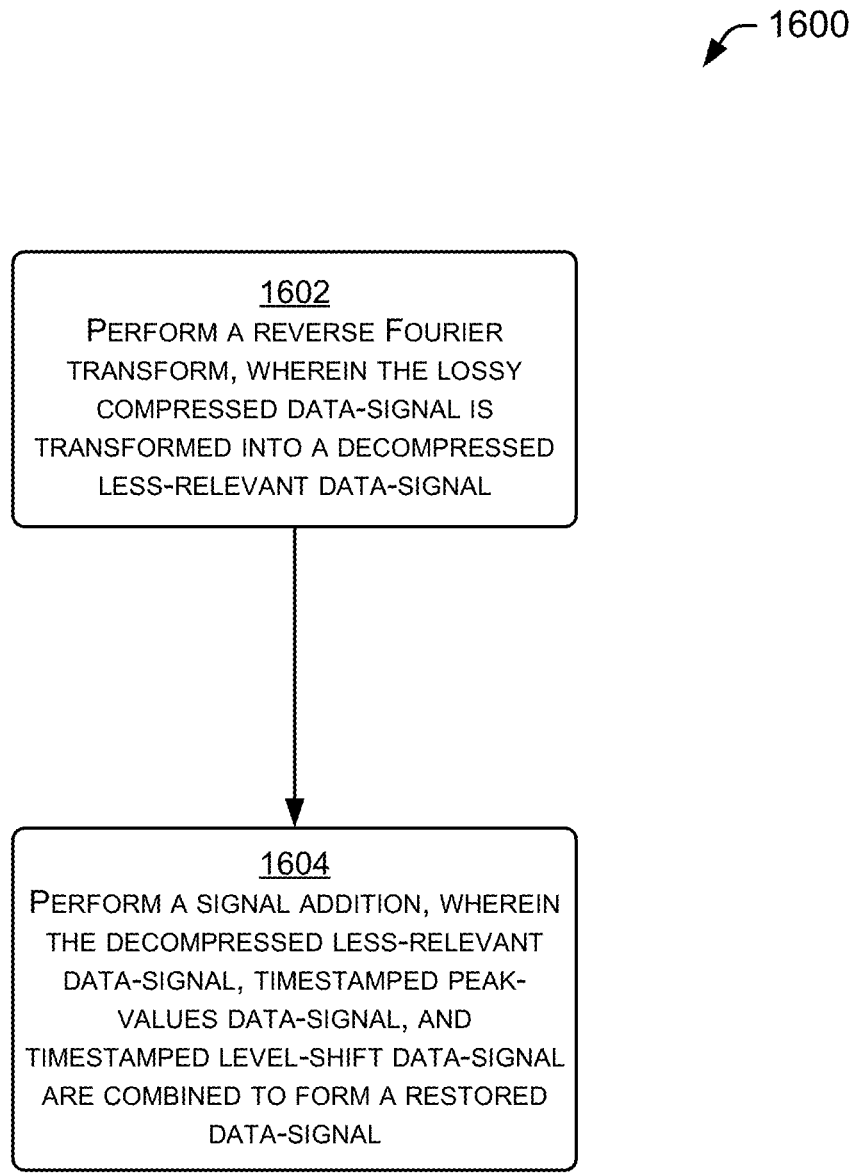
FIG. 16 is a flow diagram showing example techniques to manage data on a data-collector and/or server computing device.

FIG. 16 is a flow diagram showing example techniques to manage data on a data-collector and/or server computing device. At block 1602, a reverse Fourier transform is performed. In the transform, the lossy compressed data-signal is transformed into a decompressed less-relevant data-signal. At block 1604, a signal addition function is performed. In operation, the decompressed less-relevant data-signal, timestamped peak-values data-signal, and timestamped level-shift data-signal are combined to form a restored data-signal.

Figure 17:
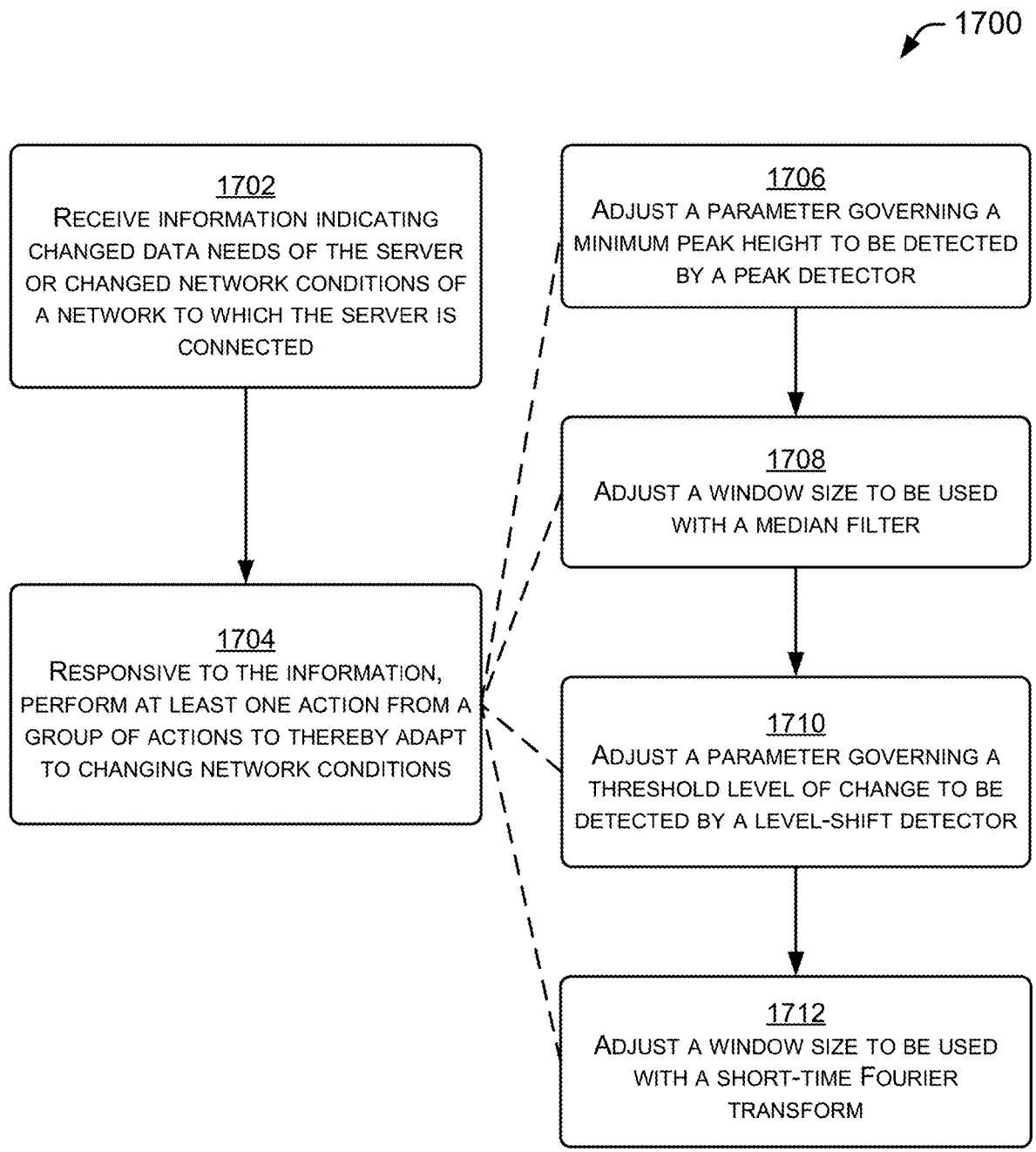
FIG. 17 is a flow diagram showing example techniques to adapt to changing network conditions.

FIG. 17 is a flow diagram showing example techniques to adapt to changing network conditions. At block 1702, information is received, indicating changed data needs of the server, or changed conditions of a network to which the server is connected. At block 1704, responsive to the information, at least one action is performed from a group of actions outlined in blocks 1706 through 1712. The actions help the utility meter and/or network node to adapt to changing network conditions. At block 1706, a parameter governing a minimum peak height to be detected by a peak detector is adjusted. At block 1708, a window size to be used with a median filter is adjusted. At block 1710, a parameter (e.g., a peak threshold) governing operation of a level-shift detector is adjusted. At block 1712, a window size to be used with a short-time Fourier transform is adjusted.

Example Systems and Devices

The following examples of efficient compression of sensor data are expressed as number clauses. While the examples illustrate a number of possible configurations and techniques, they are not meant to be an exhaustive listing of the systems, methods, techniques and/or metering devices described herein.

1. A method, comprising: receiving metrology data from a metrology device, the metrology data comprising one or more of: voltage (V) data; current (A) data; resistive power (W) data; and volt-amps reactive power (VAR) data; processing the metrology data, wherein the processing comprises: performing peak-detection on the metrology data, to create data-signals comprising: a timestamped peak-values data-signal; and a peak-removed data-signal; performing median-filtering on the peak-removed data-signal, wherein a median-filtered data-signal is created; and performing level-shift detection on the median-filtered data-signal, wherein a timestamped level-shift data-signal is created; sending data to a server, the data comprising: the timestamped peak-values data-signal; and the timestamped level-shift data-signal.

2. The method of clause 1, wherein performing peak-detection comprises: configuring a peak threshold of a peak detector; using the peak detector to identify data associated with at least one peak; and separating relevant data from less-relevant data based at least in part on the at least one peak.

3. The method of clause 1, wherein performing median-filtering comprises: configuring a time-interval window of a median filter; using the median filter to distinguish noise from relevant data; and separating the relevant data from less-relevant data based at least in part on operation of the median filter.

4. The method of clause 1, wherein performing level-shift detection comprises: configuring a shift threshold of a level-shift detector; using the level-shift detector to distinguish two or more consumption levels measured by the metrology device; and separating relevant data from less-relevant data based at least in part on the two or more consumption levels measured by the metrology device.

5. The method of clause 1, additionally comprising: determining if less-relevant data is needed by the server; and based on a need for the less-relevant data, performing actions comprising: performing signal subtraction, wherein the timestamped peak-values data-signal and the timestamped level-shift data-signal are subtracted from the metrology data to thereby create a less-relevant data-signal; performing a short-time Fourier transform on the less-relevant data-signal to result in a lossy compressed data-signal; and sending the lossy compressed data-signal to the server.

6. The method of clause 5, additionally comprising: performing a reverse Fourier transform, wherein the lossy compressed data-signal is transformed into a decompressed less-relevant data-signal; and performing a signal addition, wherein the decompressed less-relevant data-signal, timestamped peak-values data-signal, and timestamped level-shift data-signal are combined to form a restored data-signal.

7. The method of clause 1, additionally comprising: receiving information indicating changed data needs of the server or changed network conditions of a network to which the server is connected; responsive to the information, performing at least one action from a group of actions comprising: adjusting a parameter governing a minimum peak height to be detected by a peak detector; adjusting a window size to be used with a median filter; adjusting a parameter governing a threshold level of change to be detected by a level-shift detector; and adjusting a window size to be used with a short-time Fourier transform.

The method as recited in clause 1, additionally comprising one or more of, or any combination of, or all of any of, the preceding clauses.

8. A network device, comprising: a processor; a metrology device configured to measure utility consumption and to thereby produce metrology data; one or more memory devices in communication with the processor; applications defined in the one or more memory devices and executed by the processor, and wherein the applications comprise: a peak detector application, configured to receive the metrology data from the metrology device as input, and configured to create data comprising: a timestamped peak-values data-signal; and a peak-removed data-signal; a median filter application, configured to receive the peak-removed data-signal, and configured to create a median-filtered data-signal; and a level-shift detector application, configured to receive the median-filtered data-signal, and configured to create a timestamped level-shift data-signal; and a connection to a network, wherein the processor is configured to cause transmission of the timestamped peak-values data-signal and the timestamped level-shift data-signal over the connection to the network to a server.

9. The network device as recited in clause 8, additionally comprising instructions stored in the one or more memory devices, that when executed by the processor, cause the processor to perform actions comprising: responsive to a need to detect peaks of any duration, performing peak detection prior to performing median filtering; and responsive to a need to detect only peaks over a threshold duration, performing median filtering prior to performing peak detection.

10. The network device as recited in clause 8, wherein the applications additionally comprise: a filter selection application to determine which filters are to be used and an order of their use.

11. The network device as recited in clause 8, wherein the applications additionally comprise: a filter configuration application to determine parameters for use by each filter selected for operation.

12. The network device as recited in clause 8, additionally comprising: a signal subtractor, wherein the signal subtractor is configured to subtract the timestamped peak-values data-signal and the timestamped level-shift data-signal from the metrology data, to thereby create a less-relevant data-signal; and a short-time Fourier transform application, wherein the short-time Fourier transform application is configured to transform the less-relevant data-signal into a lossy compressed data-signal.

13. The network device as recited in clause 12, additionally comprising instructions stored in the one or more memory devices, that when executed by the processor, cause the processor to perform actions comprising: receiving information indicating changed data needs of the server or changed network conditions; and responsive to the information, performing at least one action from a group of actions comprising: adjusting a parameter governing a minimum peak height to be detected by a peak detector; adjusting a window size to be used with a median filter; adjusting a parameter governing a threshold level change to be detected by a level-shift detector; and adjusting a window size of the short-time Fourier transform application.

14. The network, comprising the network device as recited in clause 12 and a computing device in communication with the network device over the network, wherein the computing device comprises: a processor; one or more memory devices in communication with the processor; applications respectively defined in the one or more memory devices, and executed by the processor, the applications comprising: a reverse Fourier transform to decompress the lossy compressed data-signal, thereby creating a decompressed less-relevant data-signal; and a signal adder, to receive signals comprising: the timestamped peak-values data-signal; the timestamped level-shift data-signal; and the decompressed less-relevant data-signal, wherein the signal adder outputs a restored data-signal comprising data from the metrology data.

15. The network device as recited in clause 14, additionally comprising instructions stored in the one or more memory devices, that when executed by the processor, cause the processor to perform actions comprising: determining a need for use or non-use of the signal subtractor and the short-time Fourier transform;
  responsive to a need to use the signal subtractor and the short-time Fourier transform, creating the lossy compressed data-signal; and responsive to no need to use the signal subtractor and the short-time Fourier transform, creating the restored data-signal without using the decompressed less-relevant data-signal.

The network device as recited in clause 8, additionally comprising one or more of, or any combination of, or all of any of, the preceding clauses.

16. One or more non-transitory computer-readable media storing computer-executable instructions that, when executed by one or more processors, configure a computing device to perform acts comprising: receiving metrology data from a metrology device, the metrology data comprising one or more of: voltage (V); current (A); resistive power (W); and volt-amps reactive power (VAR) data; processing the metrology data, wherein the processing comprises: performing peak-detection on the metrology data, to create data-signals comprising: a timestamped peak-values data-signal; and a peak-removed data-signal; performing median-filtering on the peak-removed data-signal, wherein a median-filtered data-signal is created; and performing level-shift detection on the median-filtered data-signal, wherein a timestamped level-shift data-signal is created; and sending data to a server, the data comprising: the timestamped peak-values data-signal; and the timestamped level-shift data-signal.

17. The one or more non-transitory computer-readable media as recited in clause 16, wherein the acts additionally comprise: determining that a currently available network bandwidth is greater than, or less than, a previously available network bandwidth that was prior to the currently available network bandwidth; and responsive to the determining, performing at least one action from a group of actions comprising: adjusting a parameter governing a minimum peak height to be detected by a peak detector; adjusting a window size to be used with a median filter; adjusting a parameter governing a threshold level of change to be detected by a level shift detector; and adjusting a window size to be used with a short-time Fourier transform.

18. The one or more non-transitory computer-readable media as recited in clause 16, wherein the acts additionally comprise: determining a measurement of an available network bandwidth; and responsive to the measurement, adjusting a parameter of one or more tools comprising: a median filter; a level-shift detector; a peak detector; and a short-time Fourier transform; wherein if the measurement of the available network bandwidth has increased over a previous measurement of the available network bandwidth, then a first parameter of the one or more tools is adjusted to increase data sent to the server; and wherein if the measurement of the available network bandwidth has decreased over the previous measurement of the available network bandwidth, then a second parameter of the one or more tools is adjusted to decrease data sent to the server.

19. The one or more non-transitory computer-readable media as recited in clause 16, wherein the acts additionally comprise: performing signal subtraction, wherein the timestamped peak-values data-signal and the timestamped level-shift data-signal are subtracted from the metrology data to thereby create a less-relevant data-signal; performing a short-time Fourier transform on the less-relevant data-signal to result in a lossy compressed data-signal; and sending the lossy compressed data-signal to the server.

20. The one or more non-transitory computer-readable media as recited in clause 19, wherein the acts additionally comprise: receiving the timestamped peak-values data-signal, the timestamped level-shift data-signal, and the lossy compressed data-signal at the server; performing a reverse Fourier transform, wherein the lossy compressed data-signal is decompressed to result in an approximation of the less-relevant data-signal; and performing signal addition, wherein the timestamped peak-values data-signal, the timestamped level-shift data-signal, and the less-relevant data-signal are combined into a restored data-signal.

The one or more non-transitory computer-readable media as recited in clause 16, additionally comprising one or more of, or any combination of, or all of any of the preceding clauses.

Conclusion

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

The words comprise, comprises, and/or comprising, when used in this specification and/or claims specify the presence of stated features, devices, techniques, and/or components. The words do not preclude the presence or addition of one or more other features, devices, techniques, and/or components and/or groups thereof.

The invention claimed is:

1. A method, comprising:
receiving metrology data from a metrology device, the metrology data comprising one or more of:
  voltage (V) data;
  current (A) data;
  resistive power (W) data; and
  volt-amps reactive power (VAR) data;
processing the metrology data, wherein the processing comprises:
  performing peak-detection on the metrology data, to create data-signals comprising:
    a timestamped peak-values data-signal; and
    a peak-removed data-signal;
  performing median-filtering on the peak-removed data-signal, wherein a median-filtered data-signal is created; and
  performing level-shift detection on the median-filtered data-signal, wherein a timestamped level-shift data-signal is created;
sending data to a server, the data comprising:
  the timestamped peak-values data-signal; and
  the timestamped level-shift data-signal.

2. The method of claim 1, wherein performing peak-detection comprises:
configuring a peak threshold of a peak detector;
using the peak detector to identify data associated with at least one peak; and
separating relevant data from less-relevant data based at least in part on the at least one peak.

3. The method of claim 1, wherein performing median-filtering comprises:
configuring a time-interval window of a median filter;
using the median filter to distinguish noise from relevant data; and
separating the relevant data from less-relevant data based at least in part on operation of the median filter.

4. The method of claim 1, wherein performing level-shift detection comprises:
configuring a shift threshold of a level-shift detector;
using the level-shift detector to distinguish two or more consumption levels measured by the metrology device; and
separating relevant data from less-relevant data based at least in part on the two or more consumption levels measured by the metrology device.

5. The method of claim 1, additionally comprising:
determining if less-relevant data is needed by the server; and
based on a need for the less-relevant data, performing actions comprising:
  performing signal subtraction, wherein the timestamped peak-values data-signal and the timestamped level-shift data-signal are subtracted from the metrology data to thereby create a less-relevant data-signal;
  performing a short-time Fourier transform on the less-relevant data-signal to result in a lossy compressed data-signal; and
  sending the lossy compressed data-signal to the server.

6. The method of claim 5, additionally comprising:
performing a reverse Fourier transform, wherein the lossy compressed data-signal is transformed into a decompressed less-relevant data-signal; and
performing a signal addition, wherein the decompressed less-relevant data-signal, timestamped peak-values data-signal, and timestamped level-shift data-signal are combined to form a restored data-signal.

7. The method of claim 1, additionally comprising:
receiving information indicating changed data needs of the server or changed network conditions of a network to which the server is connected;
responsive to the information, performing at least one action from a group of actions comprising:
  adjusting a parameter governing a minimum peak height to be detected by a peak detector;
  adjusting a window size to be used with a median filter;
  adjusting a parameter governing a threshold level of change to be detected by a level-shift detector; and
  adjusting a window size to be used with a short-time Fourier transform.

8. A network device, comprising:
a processor;
a metrology device configured to measure utility consumption and to thereby produce metrology data;
one or more memory devices in communication with the processor;
applications defined in the one or more memory devices and executed by the processor, and wherein the applications comprise:
  a peak detector application, configured to receive the metrology data from the metrology device as input, and configured to create data comprising:
    a timestamped peak-values data-signal; and
    a peak-removed data-signal;
  a median filter application, configured to receive the peak-removed data-signal, and configured to create a median-filtered data-signal; and
  a level-shift detector application, configured to receive the median-filtered data-signal, and configured to create a timestamped level-shift data-signal; and
a connection to a network, wherein the processor is configured to cause transmission of the timestamped peak-values data-signal and the timestamped level-shift data-signal over the connection to the network to a server.

9. The network device as recited in claim 8, additionally comprising instructions stored in the one or more memory devices, that when executed by the processor, cause the processor to perform actions comprising:
responsive to a need to detect peaks of any duration, performing peak detection prior to performing median filtering; and
responsive to a need to detect only peaks over a threshold duration, performing median filtering prior to performing peak detection.

10. The network device as recited in claim 8, wherein the applications additionally comprise:
a filter selection application to determine which filters are to be used and an order of their use.

11. The network device as recited in claim 8, wherein the applications additionally comprise:
a filter configuration application to determine parameters for use by each filter selected for operation.

12. The network device as recited in claim 8, additionally comprising:
a signal subtractor, wherein the signal subtractor is configured to subtract the timestamped peak-values data-signal and the timestamped level-shift data-signal from the metrology data, to thereby create a less-relevant data-signal; and a short-time Fourier transform application, wherein the short-time Fourier transform application is configured to transform the less-relevant data-signal into a lossy compressed data-signal.

13. The network device as recited in claim 12, additionally comprising instructions stored in the one or more memory devices, that when executed by the processor, cause the processor to perform actions comprising:
receiving information indicating changed data needs of the server or changed network conditions; and
responsive to the information, performing at least one action from a group of actions comprising:
adjusting a parameter governing a minimum peak height to be detected by a peak detector;
adjusting a window size to be used with a median filter;
adjusting a parameter governing a threshold level change to be detected by a level-shift detector; and
adjusting a window size of the short-time Fourier transform application.

14. The network, comprising the network device as recited in claim 12 and a computing device in communication with the network device over the network, wherein the computing device comprises:
a processor;
one or more memory devices in communication with the processor;
applications respectively defined in the one or more memory devices, and executed by the processor, the applications comprising:
a reverse Fourier transform to decompress the lossy compressed data-signal, thereby creating a decompressed less-relevant data-signal; and
a signal adder, to receive signals comprising:
the timestamped peak-values data-signal;
the timestamped level-shift data-signal; and
the decompressed less-relevant data-signal,
wherein the signal adder outputs a restored data-signal comprising data from the metrology data.

15. The network device as recited in claim 14, additionally comprising instructions stored in the one or more memory devices, that when executed by the processor, cause the processor to perform actions comprising:
determining a need for use or non-use of the signal subtractor and the short-time Fourier transform;
responsive to a need to use the signal subtractor and the short-time Fourier transform, creating the lossy compressed data-signal; and
responsive to no need to use the signal subtractor and the short-time Fourier transform, creating the restored data-signal without using the decompressed less-relevant data-signal.

16. One or more non-transitory computer-readable media storing computer-executable instructions that, when executed by one or more processors, configure a computing device to perform acts comprising:
receiving metrology data from a metrology device, the metrology data comprising one or more of:
voltage (V);
current (A);
resistive power (W); and
volt-amps reactive power (VAR) data;
processing the metrology data, wherein the processing comprises:
performing peak-detection on the metrology data, to create data-signals comprising:
a timestamped peak-values data-signal; and
a peak-removed data-signal;
performing median-filtering on the peak-removed data-signal, wherein a median-filtered data-signal is created; and
performing level-shift detection on the median-filtered data-signal, wherein a timestamped level-shift data-signal is created; and
sending data to a server, the data comprising:
the timestamped peak-values data-signal; and
the timestamped level-shift data-signal.

17. The one or more non-transitory computer-readable media as recited in claim 16, wherein the acts additionally comprise:
determining that a currently available network bandwidth is greater than, or less than, a previously available network bandwidth that was prior to the currently available network bandwidth; and
responsive to the determining, performing at least one action from a group of actions comprising:
adjusting a parameter governing a minimum peak height to be detected by a peak detector;
adjusting a window size to be used with a median filter;
adjusting a parameter governing a threshold level of change to be detected by a level shift detector; and
adjusting a window size to be used with a short-time Fourier transform.

18. The one or more non-transitory computer-readable media as recited in claim 16, wherein the acts additionally comprise:
determining a measurement of an available network bandwidth; and
responsive to the measurement, adjusting a parameter of one or more tools comprising:
a median filter;
a level-shift detector;
a peak detector; and
a short-time Fourier transform;
wherein if the measurement of the available network bandwidth has increased over a previous measurement of the available network bandwidth, then a first parameter of the one or more tools is adjusted to increase data sent to the server; and
wherein if the measurement of the available network bandwidth has decreased over the previous measurement of the available network bandwidth, then a second parameter of the one or more tools is adjusted to decrease data sent to the server.

19. The one or more non-transitory computer-readable media as recited in claim 16, wherein the acts additionally comprise:
performing signal subtraction, wherein the timestamped peak-values data-signal and the timestamped level-shift data-signal are subtracted from the metrology data to thereby create a less-relevant data-signal;
performing a short-time Fourier transform on the less-relevant data-signal to result in a lossy compressed data-signal; and
sending the lossy compressed data-signal to the server.

20. The one or more non-transitory computer-readable media as recited in claim 19, wherein the acts additionally comprise:
receiving the timestamped peak-values data-signal, the timestamped level-shift data-signal, and the lossy compressed data-signal at the server;
performing a reverse Fourier transform, wherein the lossy compressed data-signal is decompressed to result in an approximation of the less-relevant data-signal; and performing signal addition, wherein the timestamped peak-values data-signal, the timestamped level-shift data-signal, and the less-relevant data-signal are combined into a restored data-signal.

* * * * *